(12) United States Patent
Sugai

(10) Patent No.: US 6,403,468 B1
(45) Date of Patent: Jun. 11, 2002

(54) METHOD FOR FORMING EMBEDDED METAL WIRING

(75) Inventor: Kazumi Sugai, Tokyo (JP)

(73) Assignee: NEC Corporation (JP)

(*) Notice: Subject to any disclaimer, the term of this patent is extended or adjusted under 35 U.S.C. 154(b) by 0 days.

(21) Appl. No.: 09/378,010

(22) Filed: Aug. 19, 1999

(30) Foreign Application Priority Data

Aug. 20, 1998 (JP) ............................................. 10-234030

(51) Int. Cl.⁷ ........................................... H01L 21/4763
(52) U.S. Cl. ....................... 438/633; 438/692; 438/401; 438/675
(58) Field of Search ................................ 438/692, 633, 438/675, 401, 693

(56) References Cited

U.S. PATENT DOCUMENTS 6,114,215 A * 10/2000 Osugi et al. ................. 438/401
6,136,693 A * 10/2000 Chan et al. .................. 438/633

FOREIGN PATENT DOCUMENTS

| JP | 7-58201 | 9/1995 | ......... H01L/21/768 |
| JP | H9-55363 | 2/1997 | ......... H01L/21/304 |
| JP | H9-167768 | 6/1997 | ....... H01L/21/3205 |
| JP | H10-135163 | 5/1998 | ......... H01L/21/304 |
| JP | H10-214834 | 8/1998 | ....... H01L/21/3205 |

* cited by examiner

*Primary Examiner*—Keith Christianson
*Assistant Examiner*—Yennhu B. Huynh
(74) *Attorney, Agent, or Firm*—Hayes Soloway P.C.

(57) ABSTRACT

Disclosed herein is a method for forming an embedded metal wiring comprising the steps of: forming a wiring trench, a barrier metal film and a conductive metal film; exposing the barrier metal film by polishing the conductive metal film by use of a polishing liquid and an oxidizing agent having a first concentration; and forming a wiring by polishing and removing the exposed barrier metal film by use of a polishing liquid and an oxidizing agent having a second concentration lower than the first concentration. The excessive polishing of the conductive metal occurs when an oxidizing agent having a relatively large concentration while such an oxidizing agent is needed when the barrier metal film is polished and removed. In order to attain the smooth removal of the barrier metal film and to prevent the excessive removal of the conductive metal, the oxidizing agent having a lower concentration is employed in the polishing of the conductive metal.

19 Claims, 5 Drawing Sheets

METHOD FOR FORMING EMBEDDED METAL WIRING

BACKGROUND OF THE INVENTION (a) Field of the Invention

The present invention relates to a method for forming an embedded metal wiring, more in detail to the method for forming the embedding metal wiring having reduced structural defects such as a dishing and a recess.

(b) Description of the Related Art

With the demand of miniaturization and high integration of semiconductor devices, wirings of the semiconductor device are also made thinner and multi-layered. In a method of forming a wiring layer on a dielectric film and of patterning the layer to make a wiring, deficiencies such as snapping and short-circuit failures are likely to be generated in the wiring.

In place of the method of forming the wiring on the dielectric film, a so-called Damisin process is practiced which forms an embedded metal wiring in the dielectric film.

A conventional method of forming an embedded metal wiring will be described referring to FIGS. 1A to 1E.

As shown in FIG. 1A, a photoresist film 13 is formed 11.

Then, as shown in FIG. 1B, an etching mask 13A having a desired wiring pattern is formed by patterning the photoresist film 13. By employing the etching mask 13A, the $SiO_2$ film 12 is etched to form a wiring trench 14.

After the etching mask 13A is removed, a barrier metal film 15 is formed on the $SiO_2$ film 12 including on the wall and the bottom of the wiring trench 14 as shown in FIG. 1C. The barrier metal layer 15 prevents diffusion of Cu in the silicon substrate 11 and elevates adhesion between the Cu and the $SiO_2$ film 12. Examples of the metal employed in the barrier metal film 15 include a high melting point metal such as Ti, Ta and W and a high melting metal nitride such as TiN, TaN and WN.

A conductive metal film 16, for example, a Cu film is further formed on the barrier metal film 15 as shown in FIG. 1D.

An embedded wiring Cu 17 including the barrier metal film 15 and the Cu film 16 and embedded in the wiring trench 14 is left in the trench 14 after polishing the Cu film 16 and then the barrier metal film 15 for removal by means of CMP processing which employs a polishing apparatus 20. In place of the $SiO_2$ film 11, a three-layered structure including a lower $SiO_2$ film, an etching stopper layer and an upper $SiO_2$ film may be formed to make an etching stopper for etching the wiring trench 14.

The CMP processing is conducted by employing a polishing apparatus, for example, as shown in FIG. 2.

The polishing apparatus 20 includes a polishing board 26 rotating around a rotational axis 24 and having a polishing pad 22 thereon, a wafer holder 30 rotating around a rotational axis 28 and supporting a wafer W to be polished on its bottom surface, and a polishing agent nozzle 32 for supplying a polishing agent 36 supplied from a polishing agent supplying system 34 onto the polishing pad 22 as shown in FIG. 2.

The polishing board 26 and the wafer holder 30 are driven by a driving apparatus (not shown) such as an electric motor. The wafer holder 30 includes a zipping mechanism for zipping the wafer W such as a vacuum absorption mechanism and a mechanical zipping mechanism on its bottom surface, and holding the wafer W.

A slurry-like polishing liquid including polishing particles such as alumina and silica added with an oxidizing agent such as hydrogen peroxide is used as the polishing agent.

When the CMP processing is performed, the polishing pad 22 is mounted on the polishing board 26 and the polishing agent is dropped onto the polishing pad 26 from the polishing agent nozzle 32 while the polishing pad 26 is rotated. On the other hand, the wafer W which is held on the bottom surface of the wafer holder 30 is rotated while it is pressed against the polishing pad 22.

Thereby, the bottom surface of the wafer W is polished by a desired thickness by means of a cooperative function between the polishing agent and the polishing pad 22.

However, in the above-mentioned conventional method for forming the embedded metal wiring, formation of the Cu wiring having a desired shape is difficult when the Cu wiring including the barrier metal film and the Cu film in the wiring trench is formed by polishing the Cu film and then the exposed barrier metal film.

When the width of the wiring is large, the central part thereof in the wiring trench is excessively polished to provide a concave or a so-called dishing as shown in FIG. 3A. When the width of the wiring is small, the Cu film 16 thereof in the wiring trench is entirely and excessively polished to provide a recess as shown in FIG. 3B.

Because of these reasons, the resistance of the Cu wiring 16 may be increased significantly compared to a design value by reflecting a reduced cross-sectional area of the wiring depending on a degree of polishing.

SUMMARY OF THE INVENTION

In view of the foregoing, an object of the present invention is to provide a method for forming an embedded metal wiring with reduced structural defects such as a dishing and a recess by adjusting concentrations of oxidizing agents to be employed.

The present invention provides a method for forming an embedded metal wiring comprising the steps of patterning a dielectric film overlying a semiconductor substrate to form a wiring trench having a first depth; forming a barrier metal film on said dielectric film, said barrier metal film having a thickness smaller than said first depth; forming a conductive metal film on said barrier metal film while filling said wiring trench with said conductive metal; polishing said conductive metal film by use of a polishing liquid and an oxidizing agent having a first concentration with respect to said polishing liquid to expose said barrier metal film on a region other than said wiring trench; and polishing said exposed barrier metal film by use of a polishing liquid and an oxidizing agent having a second concentration with respect to said polishing liquid lower than said first concentration to leave said barrier metal film and said conductive metal film in said wiring trench.

In accordance with the method for forming the embedded metal wiring of the present invention, the metal wiring having a sectional shape with reduced structural defects such as a dishing and a recess can be formed by employing one polishing apparatus by means of lowering a function of being polished of the conductive metal film embedded in the wiring trench, which is achieved by employing the polishing agent having the oxidizing agent of quite a low concentration when the exposed barrier metal film on the region other than the wiring trench is polished and removed.

The above and other objects, features and advantages of the present invention will be more apparent from the following description.

PREFERRED EMBODIMENTS OF THE INVENTION

The present inventor has investigated reasons for producing the structural defects such as the dishing and the recess when the embedded metal wiring is formed in accordance with the conventional method to find out the following.

Since the removal rate of the barrier metal film is remarkably faster than that of the Cu film, the polishing and the removing of the Cu proceed considerably faster than those of the barrier metal film in a process in which the barrier metal film is exposed, then polished and removed for forming the wiring in the wiring trench. Accordingly, the Cu in the wiring trench is excessively polished and removed to form the dishing and the recess.

It has been experimentally found out that the oxidizing agent, for example, $H_2O_2$ added to the polishing liquid largely contributes to the excessive polishing of the Cu, and the Cu which is oxidized by the oxidizing agent is likely to be polished.

Figure 4:
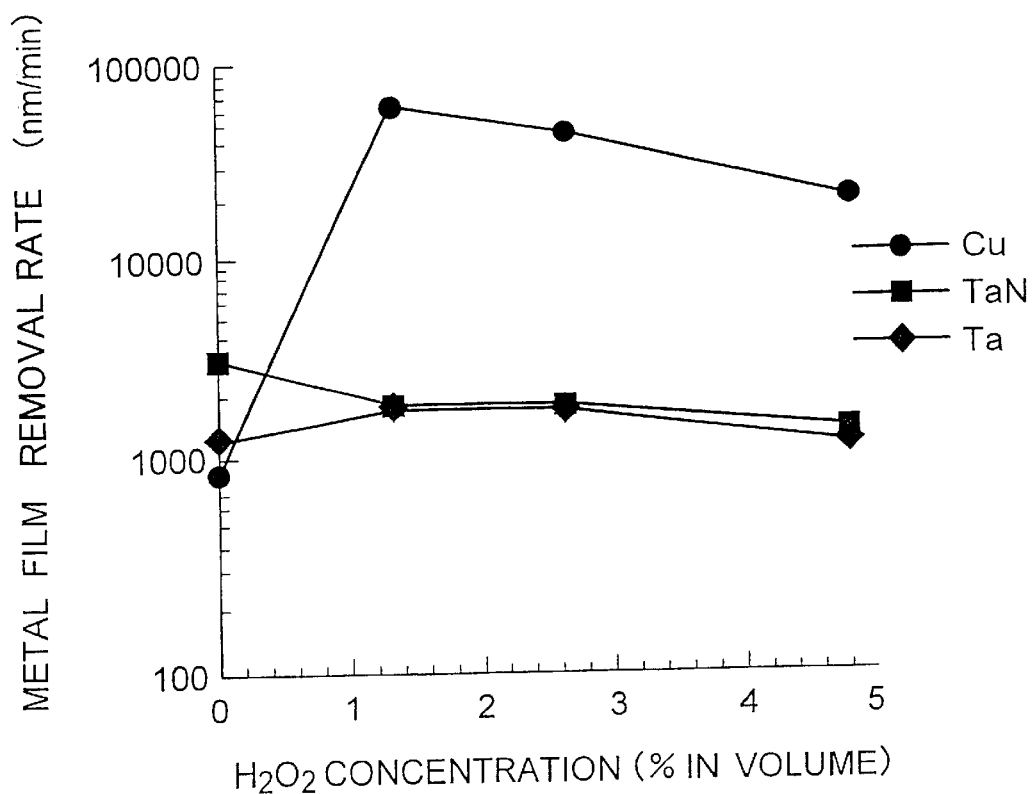
FIG. 4 is a graph showing a relation between an $H_2O_2$ concentration and a removal rate of Cu, TaN and Ta.

FIG. 4 is a graph showing a relation between an $H_2O_2$ concentration in a polishing liquid and a metal removal rate by taking an $H_2O_2$ concentration (% in volume) as a horizontal axis and a removal rate (nm/min.) of Cu, TaN and Ta as a vertical axis in which ●, ■ and ◆ show data of the Cu, the TaN and the Ta, respectively.

As apparent from FIG. 4, the TaN and the Ta constituting the barrier metal film have a similar removal rate regardless of the $H_2O_2$ concentration in the polishing liquid. On the other hand, the Cu has a remarkably higher rate at 1.4% in volume or more of the $H_2O_2$ concentration in the polishing liquid than that of the TaN and the Ta, and has a similar or a somewhat lower removal rate at 0.6% in volume or less than that of the TaN and the Ta provided that the removal rate proportionally changes between 0 and 1.4% in volume.

Accordingly, at the time of transferring to the polishing of the barrier metal film after the exposure thereof at the region other than the wiring trench, a torque which rotates the polishing board or the wafer holder of the polishing apparatus increases, and a current value of a current meter mounted on a current supplying side of an electric motor which rotates the polishing board or the wafer holder also increases. Therefore, termination of the process of exposing the barrier metal film on the region other than the wiring trench can be known by detecting the increase of the current value of the electric motor.

The second concentration is that for the oxidizing agent which lowers the removal rate of the conductive metal film. The second concentration which is lower than the first concentration may be preferably as low as to zero.

A way of supplying the polishing liquid and the oxidizing agent is not restricted, and for example the polishing agent prepared by adding the oxidizing agent to the polishing liquid to have the first or second concentration may be added onto the polishing pad, or the polishing liquid and the oxidizing agent may be separately and simultaneously supplied onto the polishing pad to obtain the first or second concentration.

The metal which forms the conductive metal film is oxidized by the oxidizing agent to be more easily polished. In other words, the metal having a similar or lower tendency of being polished compared with the barrier metal film when not oxidized can be employed.

The method of the present invention is preferably carried out when the conductive metal film is made of Cu, and is preferably carried out when the barrier metal film is made of a high melting point metal or a nitride of a high melting point metal.

A kind of the polishing liquid and a size of the abrasion grains for polishing are not restricted, and for example the polishing liquid is a slurry containing alumina particles as the abrasion grains for polishing. The oxidizing agent is preferably $H_2O_2$ or $KIO_3$.

In a preferred embodiment of the present invention, the oxidizing agent is $H_2O_2$, the first concentration is 1.4% in volume or more and the second concentration is 0.6% in volume or less.

The application of the present invention is not restricted only to the formation of the embedded metal wiring, and the present invention can be also applied to the formation of a contact plug wherein the wiring trench is a contact hole, the side wall and the bottom wall of the wiring trench are a side wall and a bottom wall of the contact hole, respectively, and the wiring is a contact plug when the contact plug made of the conductive metal is formed as part of the wiring.

Now, the present invention is more specifically described with reference to accompanying drawings.

Embodiment 1

The present embodiment is an example of a method for forming an embedded metal wiring in accordance with the present invention in which Cu and Ta are employed as a conductive metal and a barrier metal film, respectively.

Figure 5A:
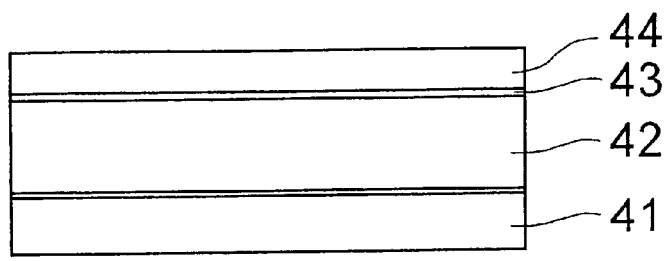
FIGS. 5A to 5G are schematic sectional views sequentially showing a method of forming an embedded metal wiring of a preferred embodiment in accordance with the present invention.

As shown in FIG. 5A, a lower $SiO_2$ film 42, an etching stopper layer 43 and an upper $SiO_2$ film 44 are sequentially formed on a silicon substrate 41.

Figure 5B:
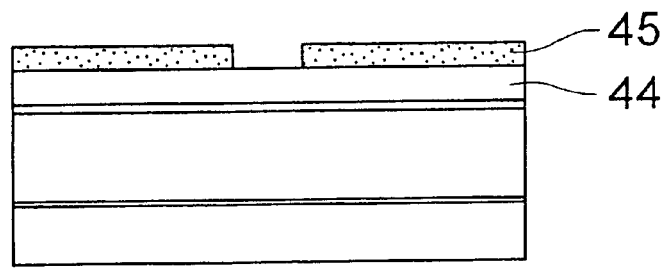

Then, a photoresist mask is formed on the upper $SiO_2$ film 44, and is subsequently patterned to make an etching mask 45 having a wiring pattern as shown in FIG. 5B.

Figure 5C:
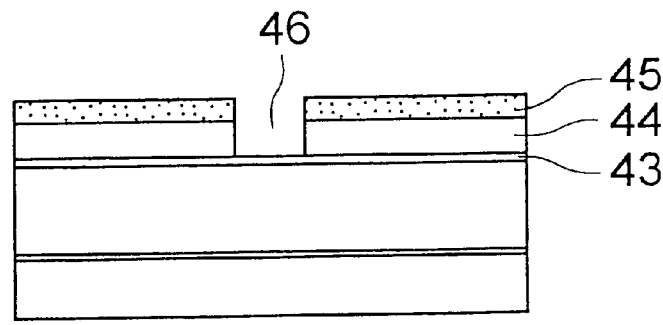

Then, the upper $SiO_2$ film 44 is etched as far as to the etching stopper layer 43 by employing the etching mask 45 to make a wiring trench 46 as shown in FIG. 5C.

Figure 5D:
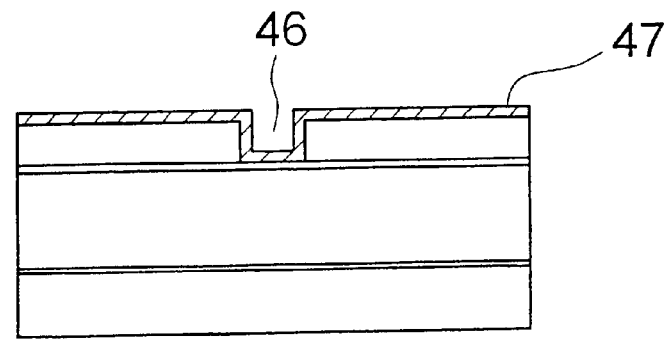

After the etching mask 45 is removed, a Ta film 47 functioning as a barrier metal film in contact with the side wall and the bottom wall of the wiring trench 46 overlying the substrate 41 is formed as shown in FIG. 5D.

Figure 5E:
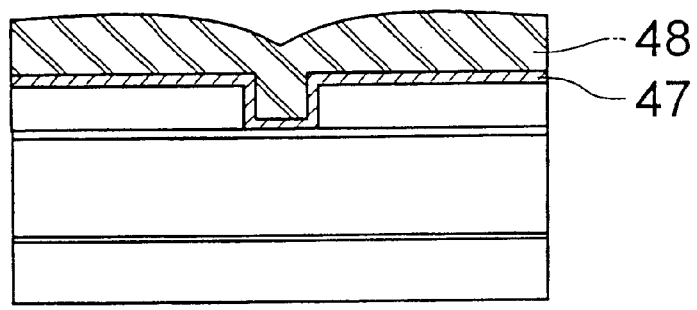

A Cu film 48 is formed on the Ta film 47 as shown in FIG. 5E.

Figure 1A:
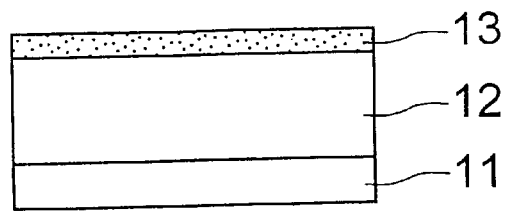
FIGS. 1A to 1E are schematic views showing sections of a substrate when a conventional method of forming an embedded metal wiring is employed.
Figure 1B:
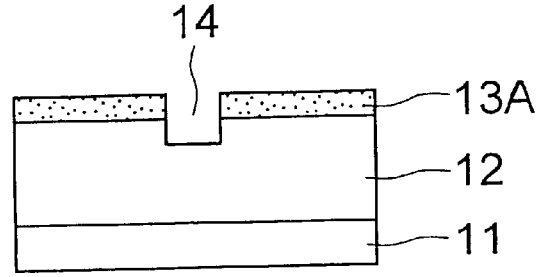
Figure 1C:
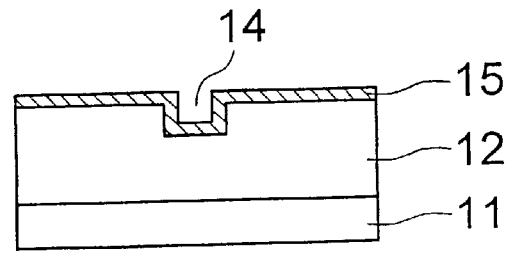
Figure 1D:
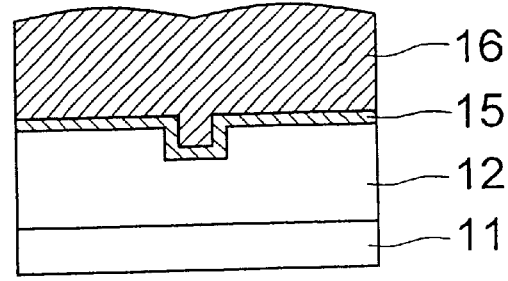
Figure 1E:
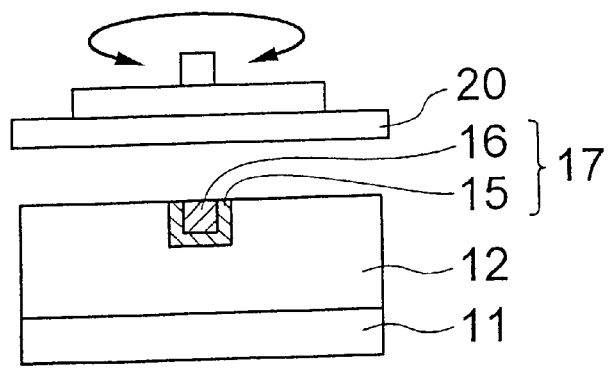
Figure 2:
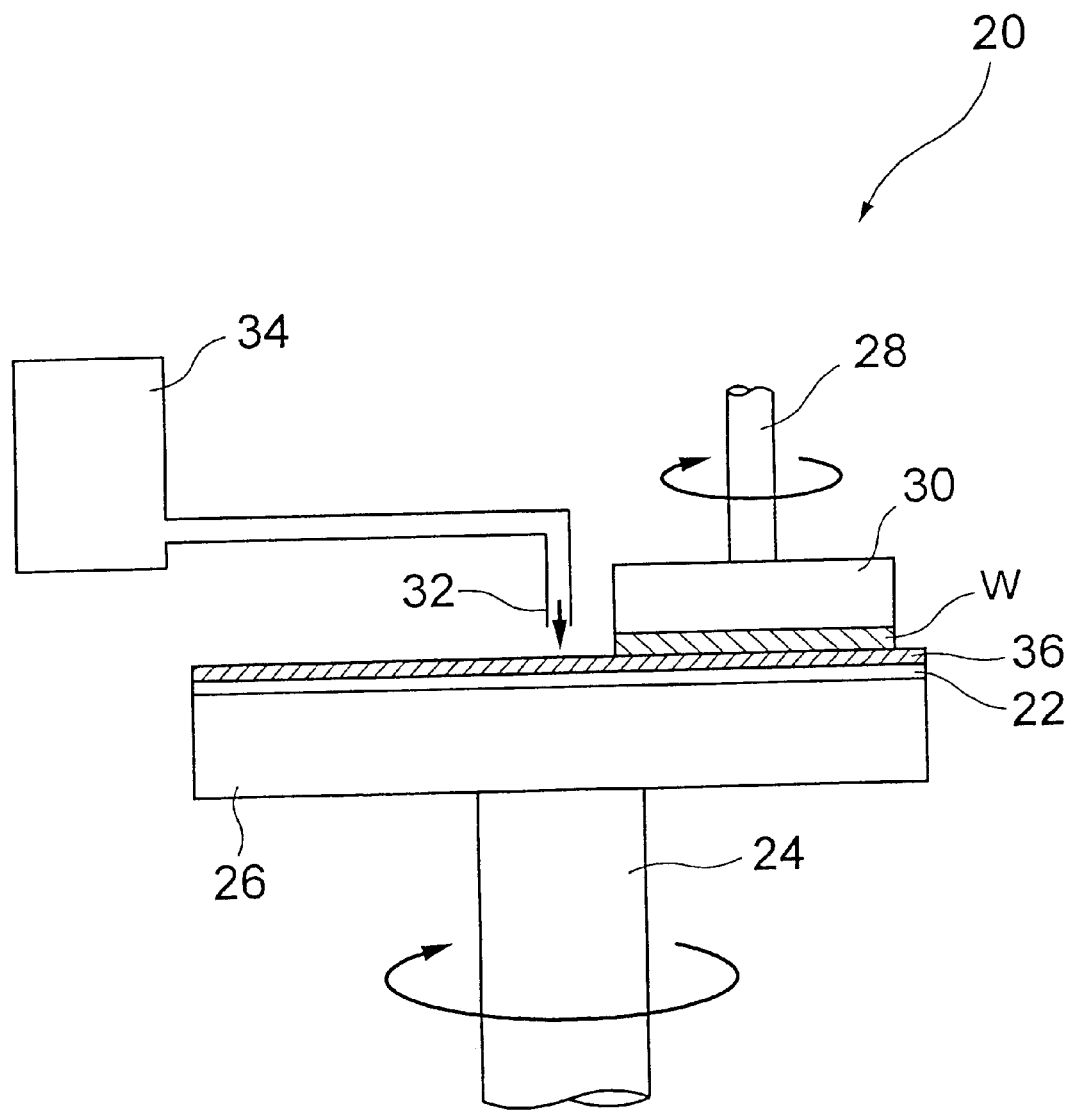
FIG. 2 is a schematic view showing a conventional polishing apparatus.
Figure 3A:
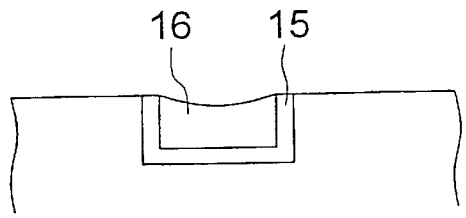
FIGS. 3A and 3B are enlarged sectional views showing structural defects of the conventional embedded metal wiring.
Figure 3B:
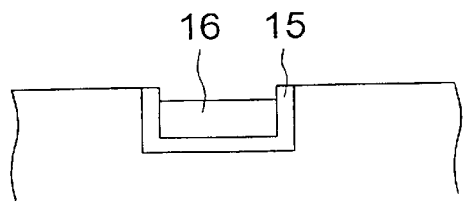
Figure 5F:
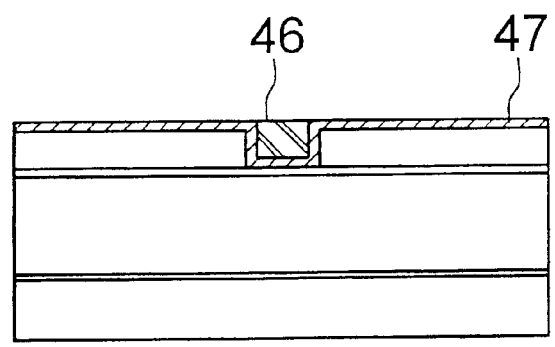

Then, the Cu film 48 is polished and removed to expose a region of the Ta film 47 other than the wiring trench 46 as shown in FIG. 5F by means of CMP processing by employing, for example, the polishing apparatus shown in FIG. 2.

A polishing agent preferably employed in this procedure includes a polishing liquid containing pure water and 1 to 10% in weight of alumina particles, as abrasion grains for polishing, having an average particle size of 0.01 to 0.1 micronmeter, and hydrogen peroxide water having a concentration of 1.4% in volume.

Termination of the step of exposing the Ta film 47 on the region other than the wiring trench 46 can be known by detecting an abrupt increase of the current value supplied to the electric motor which rotates the polishing board 26 of the polishing apparatus 46.

Figure 5G:
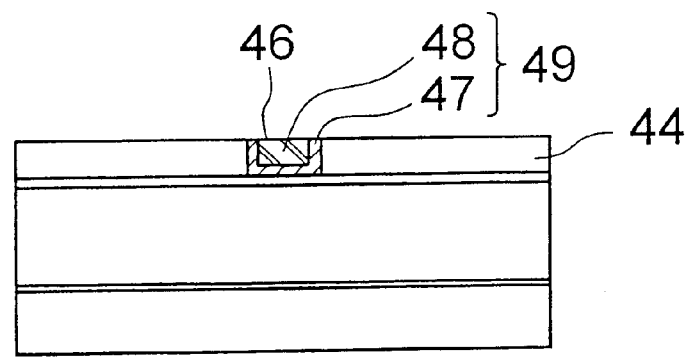

The upper SiO$_2$ film 44 on the region other than the wiring trench 46 is exposed by polishing and removing the exposed Ta film 47 by means of the CMP processing to form a Cu embedded wiring 49 including the Ta film 47 and the Cu film 48 in the wiring trench 46 as shown in FIG. 5G.

As the polishing agent in the polishing and removing step of the Ta film 47, a polishing agent prepared from a polishing liquid which contains no hydrogen peroxide or contains 0.4% in volume or less of hydrogen peroxide and is the same kind as that employed for polishing the Cu film 48 is employed.

According to the method for forming the embedded metal wiring of the present embodiment, the Cu wiring having a sectional shape with reduced structural defects such as a dishing and a recess can be formed by employing one polishing apparatus.

Although the present embodiment has been described in connection with the wiring, the present invention can be also applied to formation of a contact plug. In this case, the wiring trench, the side wall and the bottom wall of the wiring trench and the wiring are replaced with a contact hole, the side wall and the bottom wall of the contact hole and the contact plug, respectively. Since the contact hole reaches to the silicon substrate or the lower wiring through the SiO$_2$ film, formation of an etching stopper layer is unnecessary.

Since the above embodiments are described only for examples, the present invention is not limited to the above embodiments and various modifications or alternations can be easily made therefrom by those skilled in the art without departing from the scope of the present invention.

What is claimed is:

1. A method for forming an embedded metal wiring comprising the steps in sequence of:

patterning a dielectric film overlying a semiconductor substrate for forming a wiring trench having a first depth;

forming a barrier metal film on said dielectric film, said barrier metal film having a thickness smaller than said first depth;

forming a conductive metal film on said barrier metal film while filling said wiring trench with said conductive metal;

CMP polishing said conductive metal film by use of a first polishing liquid including an oxidizing agent having a volume concentration of 1.4% or more with respect to said polishing liquid, wherein said conductive metal film is oxidized by said oxidizing agent to a more easily polished material, to expose said barrier metal film on a region other than said wiring trench; and CMP polishing said exposed barrier metal film by use of a second polishing liquid including an oxidizing agent having a volume concentration of 0.6 or less with respect to said polishing liquid to leave said barrier metal film and said conductive metal film in said wiring trench.

2. The method for forming the embedded metal wiring as claimed in claim 1, wherein a polishing apparatus having a rotating polishing pad is employed and said first and second polishing liquids are supplied onto said polishing pad while said substrate is pressed against said polishing pad in said barrier metal film exposing step and in said wiring formation step.

3. The method for forming the embedded metal wiring as claimed in claim 2, wherein said first polishing liquid having said first concentration and said second polishing liquid having said second concentration are formed before being supplied onto said polishing pad.

4. The method for forming the embedded metal wiring as claimed in claim 2, wherein said first polishing liquid having said first concentration and said second polishing liquid having said second concentration are formed simultaneously with being supplied onto said polishing pad.

5. The method for forming the embedded metal wiring as claimed in claim 1, wherein said conductive metal film is made of Cu.

6. The method for forming the embedded metal wiring as claimed in claim 1, wherein said barrier metal film is made of a high melting point metal or a nitride of a high melting point metal.

7. The method for forming the embedded metal wiring as claimed in claim 1, wherein said polishing liquid is a slurry containing alumina particles as abrasive grains for polishing.

8. The method for forming the embedded metal wiring as claimed in claim 1, wherein said oxidizing agent is H$_2$O$_2$ or KIO$_3$.

9. The method for forming the embedded metal wiring as claimed in claim 1, wherein said oxidizing agent is H$_2$O$_2$ and said first concentration is 1.4% in volume or more and said second concentration is 0.6% in volume or less.

10. A method performing the embedded metal wiring as claimed in claim 1, wherein said CMP polishing is by using electric motor-driven polishing apparatus, and changeover from said first polishing liquid to said second polishing liquid is made following detection of an increase of a current value of the electric motor.

11. A method for forming a contact plug comprising the steps in sequence of:

patterning a dielectric film overlying a semiconductor substrate to form a contact hole having a first depth;

forming a barrier metal film on said dielectric film, said barrier metal film having a thickness smaller than said first depth;

forming a conductive metal film on said barrier metal film while filling said contact hole with said conductive metal;

CMP polishing said conductive metal film by use of a first polishing liquid including an oxidizing agent having a volume concentration of 1.4% or more with respect to said polishing liquid, wherein said conductive metal film is oxidized by said oxidizing agent to a more easily polished material as in claim 1, to expose said barrier metal film on a region other than said contact hole; and CMT polishing said exposed barrier metal film by use of a second polishing liquid including an oxidizing agent having a volume concentration of 0.6% or less with respect to said polishing liquid to leave said barrier metal film and said conductive metal film in said contact hole.

12. The method for forming the contact plug as claimed in claim 11, wherein a polishing apparatus having a rotating polishing pad is employed and said first and second polishing liquids are supplied onto said polishing pad while said substrate is pressed against said polishing pad in said barrier metal film exposing step and in said contact plug formation step.

13. The method for forming the contact plug as claimed in claim 12, wherein said first polishing liquid having said first concentration and said second polishing liquid having said second concentration are formed before being supplied to said polishing pad.

14. The method for forming the contact plug as claimed in claim 12, wherein said first polishing liquid having said first concentration and said second polishing liquid having said second concentration are formed simultaneously with being supplied onto said polishing pad.

15. The method for forming the contact plug as claimed in claim 11, wherein said conductive metal film is made of Cu.

16. The method for forming the contact plug as claimed in claim 11, wherein said barrier metal film is made of a high melting point metal or a nitride of a high melting point metal.

17. The method for forming the contact plug as claimed in claim 11, wherein said polishing liquid is a slurry containing alumina particles as abrasive grains for polishing.

18. The method for forming the contact plug as claimed in claim 11, wherein said oxidizing agent is $H_2O_2$ or $KIO_3$.

19. A method performing the embedded metal wiring as claimed in claim 11, wherein said CMP polishing is by using an electric motor-driven polishing apparatus, and changeover from said first polishing liquid to said second polishing liquid is made following detection of an increase of a current value of the electric motor.

* * * * *

UNITED STATES PATENT AND TRADEMARK OFFICE
CERTIFICATE OF CORRECTION

PATENT NO. : 6,403,468 B1  Page 1 of 1
DATED : June 11, 2002
INVENTOR(S) : Sugai, Kazumi It is certified that error appears in the above-identified patent and that said Letters Patent is hereby corrected as shown below:

Column 6,
Line 58, "CMT" should be -- CMP --.

Signed and Sealed this

Twenty-eighth Day of October, 2003

JAMES E. ROGAN
*Director of the United States Patent and Trademark Office*